US005426408A

United States Patent [19]

Jones et al.

[11] Patent Number: 5,426,408

[45] Date of Patent: Jun. 20, 1995

[54] CERAMIC SUPERCONDUCTING MAGNET USING STACKED MODULES

[75] Inventors: Thomas E. Jones, Spring Valley; Wayne C. McGinnis, San Diego; J. Scott Briggs, Carlsbad, all of Calif.

[73] Assignee: The United States of America as represented by the Secretary of the Navy, Washington, D.C.

[21] Appl. No.: 60,762

[22] Filed: May 7, 1993

[51] Int. Cl.[6] ........................ H01F 1/00; H01B 12/00; G11C 11/14

[52] U.S. Cl. .................................... 505/211; 505/705; 336/DIG. 1; 365/161; 335/216

[58] Field of Search .................... 335/216; 505/1, 705, 505/706, 880, 879; 336/DIG. 1; 365/161

[56] References Cited

U.S. PATENT DOCUMENTS

| | | | |
|---|---|---|---|
| 3,281,737 | 10/1966 | Swartz | 335/216 |
| 3,281,738 | 10/1966 | Hanak | 335/216 |
| 4,981,838 | 1/1991 | Whitehead | 505/1 |
| 5,079,222 | 1/1992 | Yamazaki | 505/1 |
| 5,168,259 | 12/1992 | Takemura | 335/216 |
| 5,173,678 | 12/1992 | Bellows | 335/216 |

FOREIGN PATENT DOCUMENTS

| | | | |
|---|---|---|---|
| 122592 | 5/1989 | Japan | 335/21 C |

OTHER PUBLICATIONS

W. C. McGinnis et al, "Properties of $Bi_2Sr_2CaCu_2O_8$ thick films melt-processed at temperatures up to 950°C", *J. Mater. Res.*, vol. 7, No. 3, Mar. 1992, pp. 585-591.

Author unknown, "Ceramic on Ceramic Coils", *Superconductor Incustry,* Fall 1992, p. 36.

*Primary Examiner*—Gerald P. Tolin
*Assistant Examiner*—Stephen T. Ryan
*Attorney, Agent, or Firm*—Harvey Fendelman; Thomas Glenn Keough; Michael A. Kagan

[57] ABSTRACT

A superconducting magnet module comprises an alternate series of abutting and coaxially aligned first and second superconductive magnet modules. The first magnet module includes a first substrate having opposed first and second faces and a bore filled with a superconductive material extending between the first and second faces. The first face is formed of an electrically conductive material and the second face is formed of an electrically insulating material. A first spiral track of the superconductive material is formed on the first face in electrical and thermal contact with the electrically conductive material. The first spiral track is melt fused to the superconductive material in the bore. The second magnet module includes a second substrate having opposed third and fourth faces. The third face is formed of an electrically conductive material and the fourth face is formed of the electrically insulating material. A second spiral track of the superconductive material is formed on the third face in electrical and thermal contact with the electrically conductive material. The modules are positioned so that the second track abuts the second face and is melt fused to the superconductor in the bore to provide the superconducting magnet with a solenoidal and monolithic superconductive current path.

The melt-fused spiral tracks provide the superconducting magnet with a quasi-helical and monolithic superconductive current path which may be tailored to have a uniform critical current capacity.

10 Claims, 4 Drawing Sheets

CERAMIC SUPERCONDUCTING MAGNET USING STACKED MODULES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the field of electromagnets, and more particularly to a solenoid in which the magnetic field is generated by conducting an electrical current through a coil made of a ceramic superconducting material.

A superconductor conducts an electric current with zero resistance (strictly speaking, true only for direct current). That is, the current flows through a superconductor without loss or resistive heating. The superconducting state of a superconductive material exists, however, only for temperatures, current densities, and magnetic fields below given critical values which are characteristic of that material. When these critical values are exceeded, the superconductive material becomes resistive (non-superconducting) to the flow of current.

The current-carrying capacity of superconductors can be quite high with critical current densities greater than $10^6$ A/cm$^2$. Metallic superconducting wires can be formed into coils to form magnets that can produce magnetic fields many times that of the largest iron electromagnets, and they can do so in a package small enough to be held in the palm of one's hand. The superconducting wires of choice today for such high-field magnets use NbTi and $Nb_3Sn$ as the conducting elements. These advanced materials are capable of carrying very large current densities that allow superconducting magnets to have magnetic fields in the range of 5–20 Tesla. A major drawback to metallic based superconductors, however, is that they must operate at a temperature of 4.2K. Such low operating temperatures generally require the use of liquid helium, an expensive and logistically difficult material to use.

In 1987, high temperature ceramic superconducting materials were discovered. In this field, high temperature refers to temperatures above the boiling point of liquid nitrogen (77K or −196° C.); that is, the superconducting transition temperature, or critical temperature, $T_c$, of these new materials is over 77K. Examples of such ceramic superconductors are $YBa_2Cu_3O_7$ ($T_c$=92K), $Bi_2Sr_2CaCu_2O_8$ ($T_c$=80K), and $Bi_2Sr_2Ca_2Cu_3O_{10}$ ($T_c$=110K). Ceramic superconductors are very different than metallic superconductors, such as niobium ($T_c$=9K), niobium-titanium ($T_c$=17K), and niobium germanium ($T_c$=23K), because ceramic superconductors are superconducting at much higher and more easily attained temperatures.

Ceramic superconductors have a unique morphology, resulting, in part, from the way they are synthesized and also from their intrinsically complex structure. A common method for preparing bulk pieces of ceramic superconductors is to press the powder of the superconductive compound into pellet form, which is then heated at high temperature so that adjoining pieces of powder in the pellet become connected by either a partial melting or diffusion process. Such a heat process is referred to as sintering. In sintered form, ceramic superconductors usually contain high quality grains of superconductor, which may carry large currents, separated by lower quality material referred to as weak links, or intergrain regions, which carry less current. Intergrain regions may consist of defective material (for example, off-stoichiometry or under-oxygenated), and material that includes misaligned connecting grains, impurities, or reaction by-products. Such material difficulties, along with the rather brittle nature of ceramics, have made ceramic superconductive materials to fabricate into useful shapes. For example, attempts to draw wire from ceramic superconductive materials capable of carrying large electric currents when operating in a superconducting state have resulted in only limited success. Ceramic wires suitable for winding a superconducting magnet are as yet unavailable.

Since before the turn of the century, magnets for motors, generators, and laboratory magnetic fields have been based on the electromagnet; In fact, the principle utilized in motors dates back to 1819, when the Danish physicist Hans Christian Oersted showed that electricity and magnetism were related. By 1821, the English scientist Michael Faraday had built a simple electric motor, laying the foundation for the development of practical electric motors and generators. In 1888, Nikola Tesla patented the alternating-current (AC) electric motor. A basic electromagnet operates as follows. A current-carrying wire, usually copper, is wound around a ferromagnetic material such as iron to form a solenoid or a torus. The current in the solenoidal windings produces a magnetic field intensity, H, inside and along the axis of the solenoid. The magnetic field, B, produced inside and along the axis of the solenoid is simply $B=\mu_r\mu_oH$, where $\mu_r$ is the relative magnetic permeability of the ferromagnetic material and $\mu_o$ is the permeability of free space. Thus, if the windings are wound around iron, for example, the large relative magnetic permeability, $\mu_r$, of the iron in effect produces a large gain on the order of $\mu_r$ in the magnetic field produced in the iron by the current in the windings. For a good ferromagnetic material, $\mu_r$ may be on the order of several thousand for low magnetic fields. Thus, rather modest currents can produce large magnetic fields. This effect is limited, however, by the fact that the relative magnetic permeability saturates at a magnetic field corresponding to the complete alignment of all the magnetic domains in the ferromagnet. At this saturation field, one loses the large gain, and further increases in the current produce only very small increases in magnetic field. Thus, for all practical purposes, the magnetic field strength of an electromagnet is limited by the saturation field of its ferromagnet. For an electromagnet using an iron core, the limit of magnetic field strength is a little over 2 Tesla (20 kGauss). An electromagnet that produces such a magnetic field is usually water-cooled, requires a large power supply, and is very large and cumbersome.

With the discovery and development of metallic superconducting wire in the 1960's, first NbTi and later $Nb_3Sn$, magnet development took a quantum leap forward. A superconducting magnet does not require any ferromagnetic material in order to generate a large magnetic field and exhibits no hysteresis. Inside a long solenoid wound with superconducting wire at a density of n turns per meter, carrying a current, I, the supercurrent in the windings produces a magnetic field strength, H, inside the solenoid given by H=nI. Hence the magnetic field, B, inside the solenoid is given by $B=\mu_oH=$-

$\mu_o$nI. Practically speaking, the limit to the magnetic field, B, that the superconducting magnet can produce is determined by the critical current, $I_c$, which is the maximum current the superconducting wires can carry and still remain superconducting. Below that limit, no heat is generated in the magnet; there are no electrical resistance losses. In fact, a superconducting magnet can operate in what is called the persistent mode. That is, once a current is established in the superconducting magnet, the power supply can be disconnected and removed. The field produced by the current will remain indefinitely as long as the superconducting magnet is kept cooled below its $T_c$. With electromagnets, cooling water is needed to carry away the $I^2R$ heat generated in the copper windings. However, the cooling requirements of superconducting magnets need only be enough to maintain the windings below the critical temperature, $T_c$, of the superconducting winding material. Although a superconducting magnet derives no benefit from having a high-permeability core, the large currents that the superconducting wire can carry result in magnetic fields many times that attainable with electromagnets. The critical currents attainable from commercial superconducting wires can be used to generate magnetic fields from 5 to 20 Tesla, depending on the wire material and the design of the magnet, for commercial magnets cooled with liquid helium to a temperature of 4.2K. Thus, superconducting magnets produce maximum magnetic fields from 2.5 to 10 times the saturation field of iron. Superconducting magnets may also be small and light in weight (as for example, a few pounds). By contrast, a laboratory electromagnet usually weighs several thousand pounds.

Therefore, a need exists for a superconducting magnet which is capable of operating at temperatures which equal or exceed about 20K. A further need exists for a superconducting magnet which employs ceramic based superconductors as a superconducting medium.

SUMMARY OF THE INVENTION

The present invention provides a superconducting magnet module comprising an alternate series of abutting and coaxially aligned first and second superconductive magnet modules. The first magnet module includes a first substrate having opposed first and second faces and a bore filled with a superconductive material extending between the first and second faces. The first face is formed of an electrically conductive material and the second face is formed of an electrically insulating material. A first spiral track of the superconductive material is formed on the first face in electrical and thermal contact with the electrically conductive material. The first spiral track is melt fused to the superconductive material in the bore. The second magnet module includes a second substrate having opposed third and fourth faces. The third face is formed of an electrically conductive material and the fourth face is formed of the electrically insulating material. A second spiral track of the superconductive material is formed on the third face in electrical and thermal contact with the electrically conductive material. The first and second modules are positioned so that the second track abuts the second face and is melt fused to the superconductor in the bore to provide the superconducting magnet with a solenoidal and monolithic superconductive current path. The superconducting magnet may be constructed to have a uniform critical current capacity over the length of the current path.

DESCRIPTION OF THE PREFERRED EMBODIMENT

Figure 1:
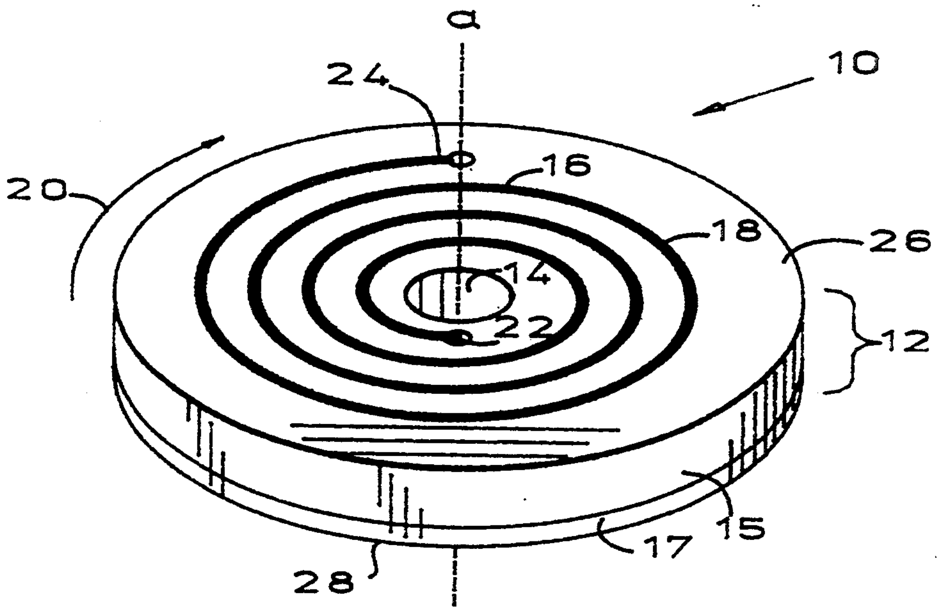
FIG. 1 shows a perspective view of a ceramic superconductive solenoid module having a clockwise oriented spiral track of superconductive material embodying various features of the present invention.
Figure 2:
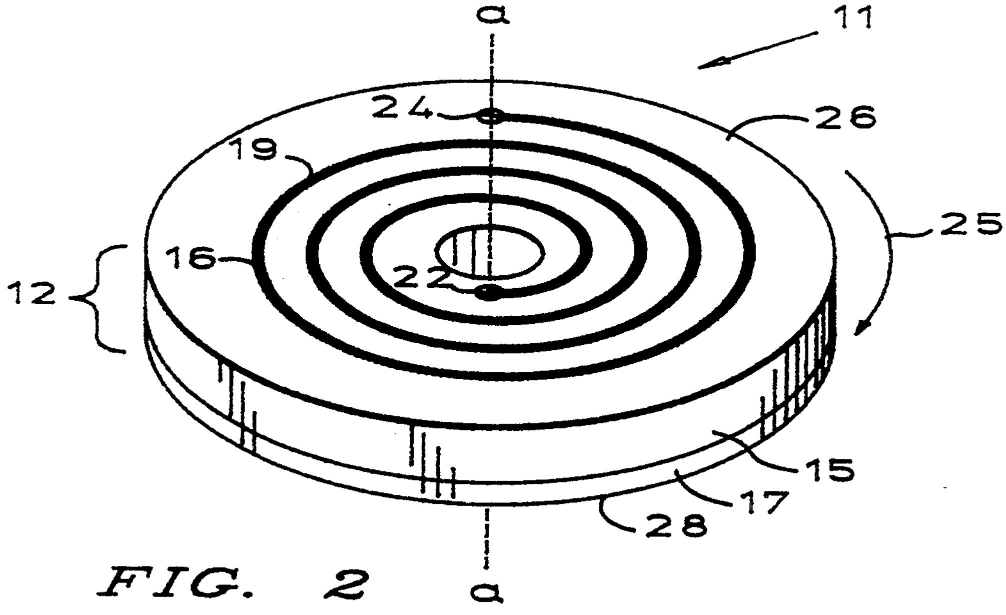
FIG. 2 shows a perspective view of a ceramic superconductive magnet module having a counterclockwise oriented spiral track of superconductive material embodying various features of the present invention.

Referring to FIG. 1, the present invention provides a ceramic superconducting magnet or magnet module 10 that includes a substrate, preferably shaped as a circular disk 12 having opposed, preferably planar obverse and reverse faces 26 and 28, respectively. An electrically conductive layer 15 forms the obverse face 26 of the disk 12, and an electrically insulating layer 17 forms the reverse face 28. By way of example, the electrically conductive layer 15 may be formed of silver or a silver alloy. The insulating layer 17 may be made of silicon dioxide formed on the silver/silver alloy electrically conductive layer 15 using standard chemical vapor deposition or sputtering techniques. The disk 12 further includes a bore 14 centered about a longitudinal axis a-a Which is perpendicular to and intersects the centers of planar faces 26 and 28. A spiral track 18 of a ceramic superconductive material 16 formed on the obverse face 26 of the disk 12 is centered about the longitudinal axis a—a. In the preferred embodiment, the spiral track 18 may be shaped as an Archimedes spiral. By way of example, the spiral track 18 may have a radius which linearly increases in the clockwise direction from a circular inner contact region 22 at the inner end of the track to an outer contact region 24 at the outer end of the track, where the direction of the spiral track 18 is indicated by the reference arrow 20. The scope of the invention also comprehends a magnet module 11 which includes a spiral track 19 which decreases in radius in the clockwise direction, as indicated by the arrow 25, as shown in FIG. 2. Thus, the module 11 (FIG. 2) has a spiral track 19, which by way of example, may have a radius which decreases linearly in the clockwise direction from a circular outer contact region 24 at the outer periphery of the track to an inner contact region 22.

Although FIGS. 1 and 2 shows spiral tracks 18 and 19 each having 3.5 turns (where 1 turn is equivalent to $2\pi$ radians), it is to be understood that the spiral tracks 18 and 19 may include any integral or fractional number turns as may be required to suit the requirements of a particular application.

The temperature at which the ceramic superconductive material 16 becomes superconducting is referred to as the critical temperature, $T_c$. Throughout this text, the term "superconductive" refers to a material which is superconducting at or below some critical temperature, whereas the term "superconducting" refers to material that is actually in a superconducting state.

An important characteristic of high temperature ceramic superconductors is that, because of their layered atomic crystal structure, the current-carrying capacity is different along different crystalline directions. That is, the critical current density, $J_c$, is anisotropic. In other words, there is a high critical current density direction and a low critical current density direction. To achieve the highest overall critical current density, the superconductive material should be formed such that the high $J_c$ direction for all parts of the final product are aligned along the same direction. When material is formed as a film or layer on a substrate surface, the alignment direction should be along that surface (since, practically speaking, any device made from such films will use current flowing parallel to the substrate surface). One technique for producing alignment along the high critical current direction is melt-processing. Once these layered structure superconductors are melted on a substrate, they tend to solidify such that the layers (atomic planes) are oriented parallel to one another and also to the substrate surface.

Examples of ceramic superconductive materials 16 having the above cited desirable properties and which are suitable for use in the present invention include the family of materials designated as $Bi_2Sr_2Ca_{n-1}Cu_nO_{2n+4}$, particularly, the n=2 compound $Bi_2Sr_2CaCu_2O_8$ having a $T_c$ (critical temperature) of about 80K and the n=3 compound $Bi_2Sr_2Ca_2Cu_3O_{10}$ having a $T_c$ near 110K. For example, $Bi_2Sr_2CaCu_2O_8$, when melted on a substrate and cooled appropriately is a single-phase, highly oriented material which has a critical current density in excess of $10^4$ A/cm$^2$ at temperatures of 20–30K.

The preparation of $Bi_2Sr_2CaCu_2O_8$ is well known, as set forth in McGinnis, W. C., and Briggs, J. S., "Properties of $Bi_2Sr_2CaCu_2O_8$ Thick Films Melt-Processed At Temperatures Up To 950° C.," *J. Mater. Res.*, Vol. 7, No. 3, pages 585–591, March 1992. The material $Bi_2Sr_2CaCu_2O_8$ may be formed into a thick film for use in the present invention first by mixing and grinding together stoichiometric amounts of $Bi_2O_3$, $SrCO_3$, $CaCO_3$, and CuO powders which are preferably 99.999% pure. The mixture then is calcined at 840° C. for about 36 hours. All processing may be performed in air. The calcined mixture then is ground to form a powder, which is then sintered at about 850° C. for 40 hours.

After sintering, the resulting $Bi_2Sr_2CaCu_2O_8$ material is thoroughly ground and mixed with a small amount of liquid, such as methanol or polyglycol, which acts as a carrier to form a spreadable paste. This paste may then be spread evenly over the disk 12 by screen-printing or other well known techniques to form a coating. The thickness of the coating determines the ultimate film thickness, which is expected to be typically in the range of 50 to 200 μm. The coated substrate is placed in a furnace, heated from room temperature to 200° C., and held there for 1 hour to remove the liquid carrier. The temperature of the coated disk 12 may then be increased at about 5° C./min to the melt-processing temperature, $T_{melt}$, of the $Bi_2Sr_2CaCu_2O_8$ powder, and held at that temperature, by way of example, for about 30 minutes in order to melt the powder. The films then are cooled at a rate of about 200° C./min to about 850° C., held there for about 6 hours, and cooled at about 5° C./min to room temperature.

The scope of the invention also includes the use of ceramic supeconductive materials other than those from the family of $Bi_2Sr_2Ca_{n-1}Cu_nO_{2n+4}$ materials. An example of such other suitable material is $YBa_2Cu_3O_7$. Although not easily melt processable, the superconductive material $YBa_2Cu_3O_7$ may be processed as a thin film. To achieve highly-oriented, high critical current $YBa_2Cu_3O_7$ suitable for use as the superconductive material 16, $YBa_2Cu_3O_7$ may be epitaxially grown as a thin film, up to about 1 μm thick on an appropriate substrate, such as $SrTiO_3$ or MgO. Thin films of $YBa_2Cu_3O_7$ readily yield current densities over $10^6$ A/cm$^2$.

Referring again to FIG. 1, the electrically conductive layer 15 forming the obverse face 26 of the disk 12 is preferably made of silver, or a silver alloy. Silver has been shown to be generally chemically nonreactive with $Bi_2Sr_2CaCu_2O_8$ and $YBa_2Cu_3O_7$, and remains in a solid state at temperatures in the range of about 900° C. which are necessary in order to melt the $Bi_2Sr_2Ca_{n-1}Cu_nO_{2n+4}$. Small amounts of silver added to $Bi_2Sr_2CaCu_2O_8$ and $Bi_2Sr_2Ca_2Cu_3O_{10}$ may actually slightly increase the critical current density of these materials. The obverse face 26 of the disk 12 may also be made of silver-coated or gold-coated stainless steel or other electrically conductive alloys which provide the disk with sufficient structural strength and low electrical resistance.

The fabrication of a superconducting solenoid module 10 embodying various features of the present invention may be accomplished by many methods. For example, a spiral groove, not shown, may be formed in the obverse face 26 of the disk 12 using well known machining, injection molding, stamping, or photolithographic techniques. The groove may then be filled with the superconductive material 16 in the form of paste, as previously described. The module 10 then may be placed in a furnace and heated to a temperature slightly beyond the melting point of the 8 superconductive material 16, generally about 900° C. for $Bi_2Sr_2CaCu_2O_8$. The heated module 10 then is maintained at that temperature for about thirty minutes, and then quickly cooled, at about 200° C./min, to an annealing temperature below the melting point of the superconductive material 16. The annealing temperature of $Bi_2Sr_2CaCu_2O_8$ is typically 850° C. The module 10 is maintained at this temperature for about six hours, and then is cooled to room temperature at about 5° C./min. Other processing temperatures, times, and cooling rates may be used in order to optimize the superconducting properties (such as critical current density) of the superconductive material 16 or to enhance the magnetic-field-producing capability of the module 10.

Referring to FIG. 1, a layer of superconductive material 16 may also be formed, by way of example, into a spiral track 18 onto the planar obverse face 26 of the disk 12 using standard screen printing or shadow masking techniques. The module 10 is then melt-processed, as described above, to orient the superconductive material so that it may function as a high-current carrying superconductor at or below the critical temperature and critical magnetic field of the superconductive material 16.

Figure 3:
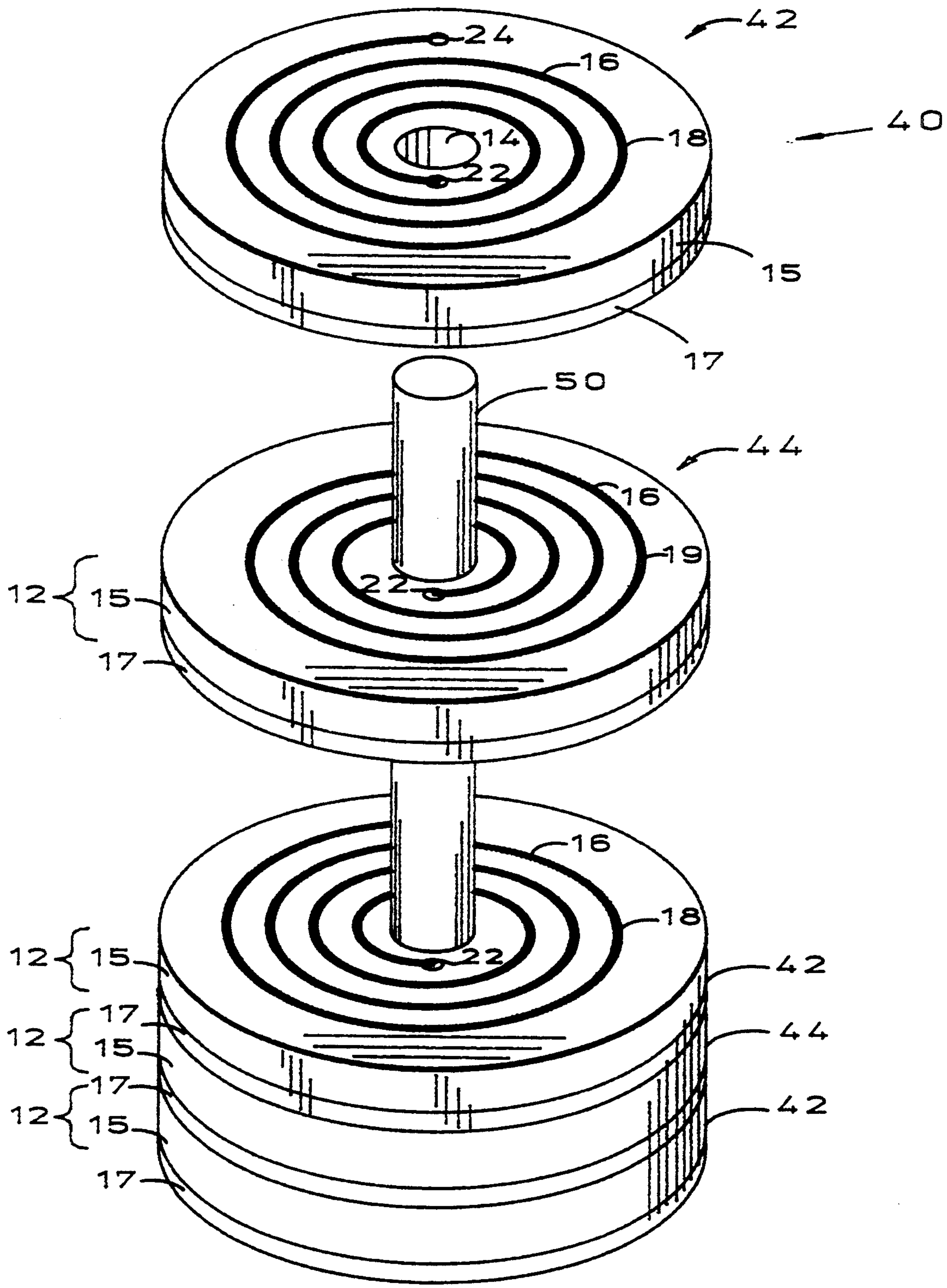
FIG. 3 shows the assembly of a ceramic superconducting magnet comprising a series of the superconducting magnet modules of the type depicted in FIGS. 1 and 2.
Figure 4:
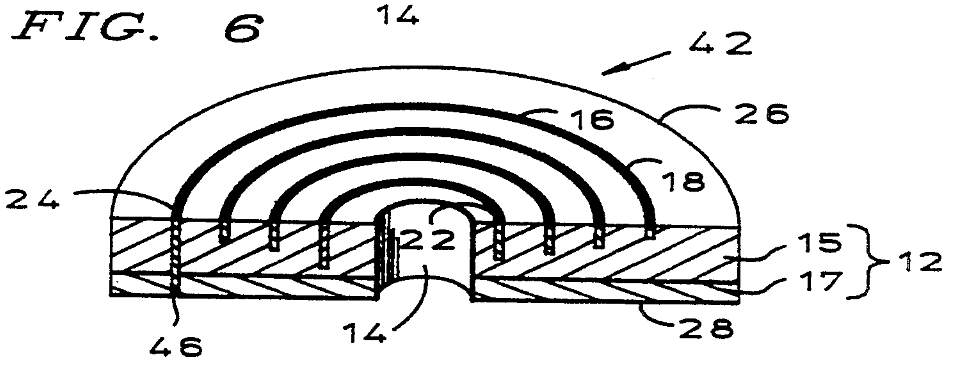
FIG. 4 shows a cutaway perspective view of the superconducting magnet module of the type shown in FIG. 1.
Figure 5:
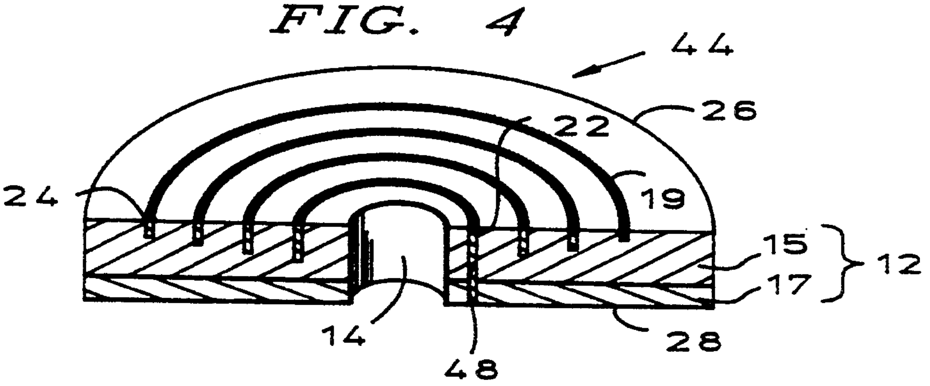
FIG. 5 shows a cutaway perspective view of the superconducting magnet module of the type shown in FIG. 2.

Referring now to FIG. 3, a superconductive solenoid 40 embodying various features of the present invention may be fabricated to include an alternating series of two or more serially connected modules 42 and 44, as shown in FIGS. 4 and 5. The spiral tracks of successive modules alternately spiral inwardly and outwardly to provide the solenoid 40 with a quasi-helical superconductive current path. The spiral tracks 18 and 19 of the magnet modules 42 and 44, respectively, preferably are mirror images of each other to facilitate the electrical interconnection of the spiral tracks 18 and 19 of the serially abutting modules 42 and 44, respectively, and to assure that current conducted through the spiral tracks of the stacked modules spirals in the same direction.

The modules 42 and 44 may be constructed in a manner similar to the construction of the modules 10 and 11, described above. However, in order to electrically connect the magnet modules in series and to an external voltage supply 43, the magnet module 42 is preferably modified, as shown in FIG. 4, to include a bore 46 preferably extending perpendicularly from the center of outer contact region 24 of the spiral track 18 through to the planar reverse face 28 of the disk 12.

Figure 6:
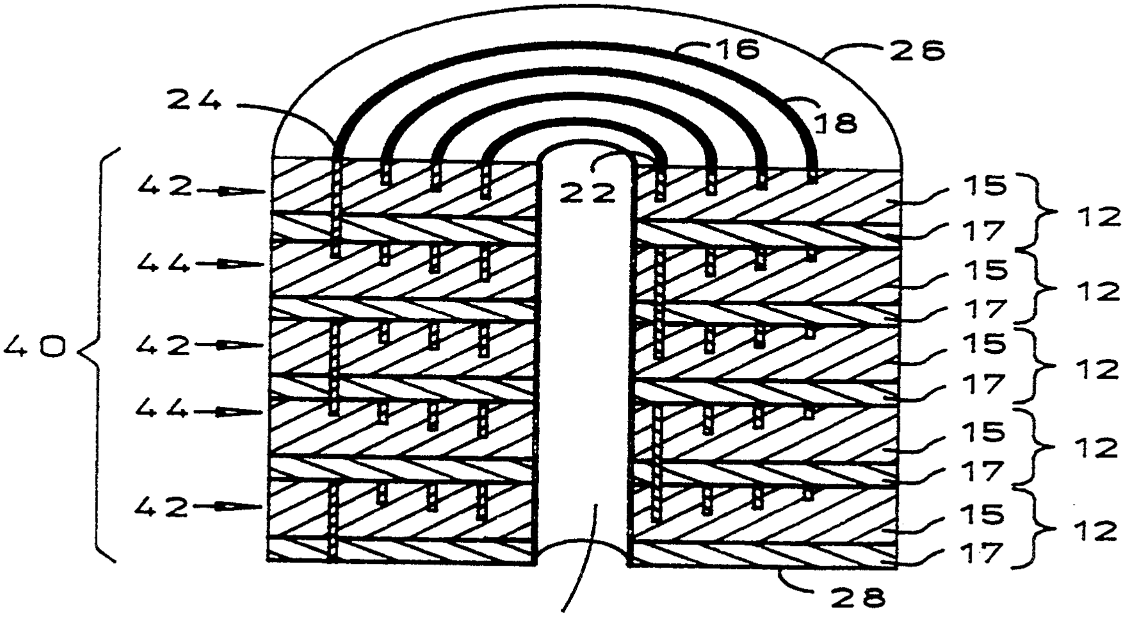
FIG. 6 is a cutaway perspective view of a superconductive magnet comprised of an alternating series of the magnet modules of FIGS. 4 and 5.

The magnet module 44, as shown in FIG. 5, includes a bore 48 preferably extending perpendicularly from the inner contact region 22 of the spiral track 19 through to the planar reverse face 28 of the disk 12. The bores 46 and 48 of the magnet modules 42 and 44, respectively, are preferably filled with superconductive material 16 in paste form which is retained in these bores. Then the magnet modules 42 and 44 may be alternately stacked together by fitting the bores 14 of the modules over the assembly support tube 50. As shown in FIG. 6, the modules must be aligned so that the inner contact regions 22 of the magnet modules 42 contact the superconductive material 16 in paste form which was previously packed in the bores 48 of the overlying magnetic modules 44, as shown in FIG. 3. Proper alignment of the magnet modules 42 and 44 may be facilitated by any of several techniques known by those skilled in the art, as for example, by employing conforming tabs and grooves, not shown, in the mating faces (the abutting obverse faces 26 of the modules 42 and the reverse faces 28 of the magnet modules 44) of the disks 12. The assembly of the stacked modules 42 and 44 are again melt-processed as described above. During the melt-processing, the superconductive material 16 in the bores 46 and 48 and the superconductive material in the spiral tracks 18 and 19 melt and fuse together. After processing, the superconductive material 16 both in the spiral tracks 18 and 19 and in the bores 46 and 48, will have solidified into a monolithic, ceramic superconductive solenoid providing electrical continuity between all modules 42 and 44.

The magnet modules 42 and 44 may be made quite thin and closely spaced to create a superconducting magnet 40 capable of generating a strong magnetic field. Electrodynamically, as far as the generation of magnetic fields are concerned, the effect of closely spaced modules is akin to having a wire tightly wound as a coil (a solenoid). Current traveling in a solenoidal path down a long stack of modules will produce an interior magnetic field, B, given by $B=\mu_o nI$, where I is the circulating supercurrent, n is the number of turns per unit length of the spiral track of the superconductive material, and $\mu_o$ is the permeability of free space.

Figure 7:
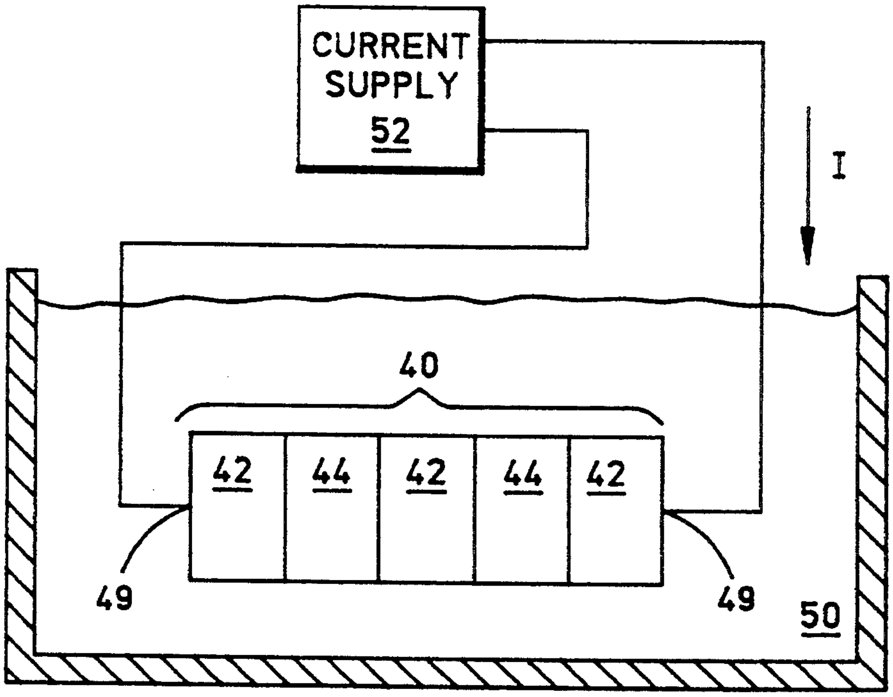
FIG. 7 illustrates the operation of a superconducting magnet in a cryogenic fluid.

In the operation of the ceramic superconducting magnet 40, described with reference to FIG. 7, the magnet 40 may be cooled, for example, by immersion in a cryogenic liquid 50 such as liquid helium, liquid hydrogen, or liquid nitrogen, depending on the required operating conditions and properties of the superconductive material 16. The purpose of the cryogenic liquid 50 is to maintain the magnet 40 at a temperature at or below the critical temperature of the superconductive material 16. The magnet 40 may also be cooled below its critical temperature using a low-temperature refrigerator, not shown. Current supply 52, connected between the contact regions 49 of the spiral tracks of the two magnet modules 42 and 44 at opposite ends of the superconducting magnet 40, causes electrical current I to flow in a quasi-helical path through the monolithic superconductive coil. The spirally directed current generates a magnetic field in the coaxially aligned and contiguous bores 14 of the modules.

A number of design considerations that affect the operation and performance of the superconducting magnet 40 are discussed below.

The critical current density, $J_c$, of a superconducting material decreases as the magnetic field to which the superconducting material is exposed, increases. By way of example, well-oriented, melt-processed thick films of $Bi_2Sr_2CaCu_2O_8$ have exhibited a reduction in the transport $J_c$ by a factor of three when the magnetic field to which the film was exposed increased from 0 to 8 Tesla (at a temperature of 4.2K). Indeed, the magnetic field produced by the superconducting magnet 40 is expected to reduce the critical current of the superconducting spiral tracks 18 and 19 (that carry the current producing the magnetic field) relative to the value at zero magnetic field. If the critical current is exceeded, the superconductive material 16 will no longer be superconducting with zero resistance, but becomes resistive. In the resistive state, the superconductive material 16 can no longer conduct the high current necessary to produce the desired magnetic field without excessive heating. In this case, the magnetic field, or the magnet 40, is said to be quenched. In fact, if any part of the superconducting current path becomes resistive, the resultant heating will generally raise the temperature of the rest of the magnet 40 very possibly beyond the critical temperature of the superconductive material 16.

In the present invention, the inner turns of spiral tracks 18 and 19 experience a larger magnetic field than the outer turns. Because of the reduction of the critical current with increasing magnetic field, these inner turns have a lower critical current density than do the outer turns. If the spiral tracks 18 and 19 have a uniform cross-sectional area, the critical current of the inner turns is exceeded before that of the outer turns. This non-uniform critical current can lead to premature quenching of the magnet 40 (before the desired magnetic field is achieved). To overcome this problem, the cross-sectional area of the spiral tracks 18 and 19 in the direction normal to the electrical current conducted through the spiral tracks may be gradually increased as the spiral tracks 18 and 19 wind toward the center of the modules 42 and 44, respectively. Such cross-sectional area may be increased by increasing the depth, as shown in FIGS. 4–6, or width of the spiral tracks 18 and 19.

As previously described, melt-processing produces superconductive films aligned along the high $J_c$ (critical current density) direction. However, the current that flows through the superconductive material 16 in the bores 46 and 48 of the modules 42 and 44 is conducted along the low $J_c$ direction. The critical current density of the superconductive material 16 is considerably less in the low $J_c$ direction than in the high $J_c$ direction.

However, the cross-sectional area of the disk interconnection region at bores 46 and 48 may be made a factor of 10–100 times larger than the cross-sectional area of the spiral tracks 18 and 19 to compensate for the anisotropy of the critical current density. In this way, the actual critical current (not critical current density) can be made the same for both the spiral tracks and the inter-disk connections. However, the anisotropy of $J_c$ should be measured for the materials oriented "as-melted", in order to properly size the relative cross-sectional areas.

The obverse faces 26 of the modules 10 and 11 are electrically conducting for thermal stability. Should part of the superconductive material 16 in tracks 18 and 19 become resistive, the current that was flowing in that material would flow in the now less resistive metallic conductor. Without this alternate, parallel current path, the now relatively resistive superconductive material would probably heat very rapidly and be destroyed. Even the cryogenic liquid cooling the magnet 40 would probably not be capable of removing this suddenly appearing heat energy quickly enough from the now resistive material to prevent damage to it. As further protection against this type of magnet quenching, it may be desirable to form a layer of a metallic conductor, not shown, such as silver over the spiral tracks 18 and 19 formed on the obverse faces 26 of the modules 42 and 44.

The operating temperature of a superconducting magnet embodying various features of the present invention depends on both the choice of superconductive material and the quality of that material. For example, the transition (zero resistance) temperature for thick films of $Bi_2Sr_2CaCu_2O_8$ processed in air is approximately 80–85K. This temperature may be increased somewhat by processing the superconductive material 16 in an atmosphere with an oxygen partial pressure lower than that of air.

One way to increase the strength of the magnetic field generated by the ceramic superconducting magnet 40 is to increase the value of the value of nI, the product of winding density, n, and current, I. For example, to increase the magnetic field strength of the solenoid 40 by 50%, the number of turns per spiral on a disk could be increased by 50%.

Obviously, many modifications and variations of the present invention are possible in light of the above teachings. For example, the magnet 40 is shown in FIG. 6 as including two modules 44 each sandwiched between a module 42. However, it is to be understood that the magnet 40 may be constructed to include an alternating series of any suitable number of modules 42 and 44. It is therefore to be understood that within the scope of the appended claims, the invention may be practiced otherwise than as specifically described.

We claim:

1. A superconducting magnet, comprising:
an alternate series of abutting and coaxially aligned first and second superconductive magnet modules, where
said first superconductive magnet module includes:
a first substrate having opposed first and second faces and a bore extending between said first and second faces where said first face is formed of an electrically conductive material, said second face is formed of an electrically insulating material, and said bore which is filled with a superconductive material;
a first spiral track of said superconductive material formed on said first face in electrical and thermal contact with said electrically conductive material, said first spiral track being melt fused to said superconductive material in said bore; and
said second superconductive magnet module includes:
a second substrate having opposed third and fourth faces where said third face formed of said electrically conductive material and said fourth face is formed of said electrically insulating material;
a second spiral track of said superconductive material formed on said third face in electrical and thermal contact with said electrically conductive material; whereby
said first and second magnet modules are positioned so that said second spiral track abuts said second face and is melt fused to said superconductive material in said bore to provide said superconducting magnet with a selenoidal and monolithic superconductive current path.

2. The superconductive magnet of claim 1 wherein:
said first spiral track includes an inner contact region and said bore extends from said inner contact region to said second face;
said second spiral track includes an inner contact region; and
said superconductive material filling said bore electrically couples said inner contact region of said second spiral track to said inner contact region of said first spiral track.

3. The superconductive magnet of claim 1 wherein;
said first spiral track includes an outer contact region and said bore extends from said outer contact region to said second face;
said second spiral track includes an outer contact region; and
said superconductive material filling said bore electrically couples said outer contact region of said second spiral track to said outer contact region of said first spiral track.

4. The superconducting magnet of claim 1 further including means for cooling said superconductive material to transform said superconductive material into a superconducting material.

5. The superconducting magnet of claim 4 further including a current source coupled to said superconducting material to induce an electrical current to flow through said superconducting material.

6. The superconducting magnet of claim 1 wherein said superconducting material includes elements selected from the group consisting of bismuth, strontium, calcium, copper, yttrium and barium.

7. The superconducting magnet of claim 1 wherein said electrically conductive material includes silver.

8. A superconducting magnet, comprising:
an alternate series of abutting and coaxially aligned first and second superconductive magnet modules, where
said first superconductive magnet module includes:
a first substrate having opposed first and second faces and a first bore extending between said first and second faces where said first face is formed of an electrically conductive material, and said second face is formed of an electrically insulating material, and said first substrate includes a second bore extending between said first and second faces filled with a superconductive material:

a first spiral track of said superconductive material formed on said first face in electrical and thermal contact with said electrically conductive material, and an outer contact region; and said second superconductive magnet module includes:

a second substrate having opposed third and fourth faces and a third bore extending between said third and fourth faces where said third face is formed of said electrically conductive material and is abutted against said second face of said first superconductive magnet module, and said fourth face is formed of said electrically insulating material;

a second spiral track of said superconductive material formed on said third face in electrical and thermal contact with said electrically conductive material, an inner contact region, and an outer contact region; whereby said superconductive material filling said second bore of said first substrate provides a first superconductive current path between said first spiral track and said second spiral track; and said alternate series of abutting and coaxially aligned first and second superconductive magnet modules are heated sufficiently to transform said superconductive material of said first and second spiral tracks and of said first superconductive current path into a quasi-helical and monolithic superconductive electric current path.

9. A superconducting magnet, comprising:

an alternate series of abutting and coaxially aligned first and second superconductive magnet modules, where said first superconductive magnet module includes:

a first substrate having opposed first and second faces and a first bore extending between said first and second faces where said first face is formed of an electrically conductive material, and said second face is formed of an electrically insulating material, and said first substrate includes a second bore extending between said first and second faces filled with a superconductive material;

a first spiral track of said superconductive material formed on said first face in electrical and thermal contact with said electrically conductive material, an inner contact region, and an outer contact region; and said second superconductive magnet module includes:

a second substrate having opposed third and fourth faces and a third bore extending between said third and fourth faces where said third face is formed of said electrically conductive material and is abutted against said second face of said first superconductive magnet module, and said fourth face is formed of said electrically insulating material;

a second spiral track of said superconductive material formed on said third face in electrical and thermal contact with said electrically conductive material, an inner contact region, and an outer contact region; whereby said superconductive material filling said second bore of said first substrate provides a first superconductive current path between said first spiral track and said second spiral track; and said alternate series of abutting and coaxially aligned first and second superconductive magnet modules are heated sufficiently to melt process said superconductive material of said first and second spiral tracks and of said first superconductive current path into a quasi-helical and monolithic superconductive electric current path so that said melt processed superconductive material is aligned along a high critical current density direction.

10. A superconducting magnet, comprising:

an alternate series of abutting and coaxially aligned first and second superconductive magnet modules, where said first superconductive magnet module includes:

a first substrate having opposed first and second faces and a bore extending between said first and second faces where said first face is formed of an electrically conductive material, said second face is formed of an electrically insulating material, and said bore which is filled with a superconductive material;

a first spiral track of said superconductive material having a first critical current capacity formed on said first face in electrical and thermal contact with said electrically conductive material, said first spiral track being melt fused to said superconductive material in said bore; and said second superconductive magnet module includes:

a second substrate having opposed third and fourth faces where said third face formed of said electrically conductive material and said fourth face is formed of said electrically insulating material;

a second spiral track of said superconductive material having a second critical current capacity formed on said third face in electrical and thermal contact with said electrically conductive material; whereby said first and second magnet modules are positioned so that said second track abuts said second face and is melt-fused to said superconductive material in said bore to form a melt-fused superconductive junction having a third critical current capacity, thereby providing said superconducting magnet with a solenoidal and monolithic superconductive current path, and said third critical current capacity is equal to or greater than each of said first and second critical current capacities.

* * * * *